430-311 SB
8/3/86 03 000+102

United States Statutory Invention Registration [19]

[11] Reg. Number: H102
[45] Published: Aug. 5, 1986

Rubinstein et al.

[54] CONTROLLING RESOLUTION OF EXPOSED RESIST IN DEVICE LITHOGRAPHY

[75] Inventors: Michael Rubinstein, New Providence; Vladimir Starov, Berkeley Heights, both of N.J.

[73] Assignee: AT&T Bell Laboratories, Murray Hill, N.J.

[21] Appl. No.: 669,773

[22] Filed: Nov. 9, 1984

[51] Int. Cl.[4] ..... C03C 5/16
[52] U.S. Cl. ..... 430/311; 430/325; 430/331
[58] Field of Search ..... 430/325, 323, 331, 311, 430/967

[56] References Cited

U.S. PATENT DOCUMENTS

| | | | |
|---|---|---|---|
| 4,185,202 | 1/1980 | Dean et al. | 250/492 A |
| 4,225,664 | 9/1980 | Moran et al. | 430/306 |
| 4,232,110 | 11/1980 | Taylor | 430/313 |
| 4,396,704 | 8/1983 | Taylor | 430/311 |

OTHER PUBLICATIONS

*Technical Digest 1980 IEDM*, "Scaling the Micron Barrier with X-Rays" by M. P. Lepselter, pp. 42–44.
*Proceedings of the IEEE*, vol. 71, No. 5, May 1983, "A Systems Approach to 1-μm NMOS", by M. P. Lepselter et al., pp. 640–656.
*Polymer Engineering and Science*, Jun. 1977, vol. 17, No. 6 "Sensitive Chlorine Containing Resists for X-Ray Lithography" by G. N. Taylor et al., pp. 420–429.
*Journal Vacuum Science Technology*, 16(6), Nov./Dec. 1979, "Improved Resolution for DCOPA Negative X-Ray Resist by Exposure Under a Controlled Atmosphere of Nitrogen and Oxygen" pp. 2020–2024, by J. M. Moran et al.
*Journal Vacuum Science Technology*, 19(4), Nov./Dec. 1981 "Organosilicon Monomers for Plasma-Developed X-Ray Resists", pp. 872–880, by G. N. Taylor et al.
Gazard et al., "Lithographic Technique using Radiation-Induced Grafting. . .", Polymer and Engineering Sci. Nov. 1980 vol. 20 (16).

*Primary Examiner*—John F. Terapane
*Assistant Examiner*—S. Wolffe
*Attorney, Agent, or Firm*—Lucian C. Canepa

[57] ABSTRACT

In certain negative resists utilized for high-resolution lithography, cross-linking persists even after the exposing radiation is removed. This phenomenon causes exposed features to become enlarged. In accordance with the present invention, cross-linking in exposed resist regions is effectively quenched by purposely subjecting the exposed regions to oxygen immediately following exposure to cross-linking radiation. In, for example, full-field or step-and-repeat X-ray lithography, such quenching enables the consistent attainment of submicron features.

17 Claims, 1 Drawing Figure

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

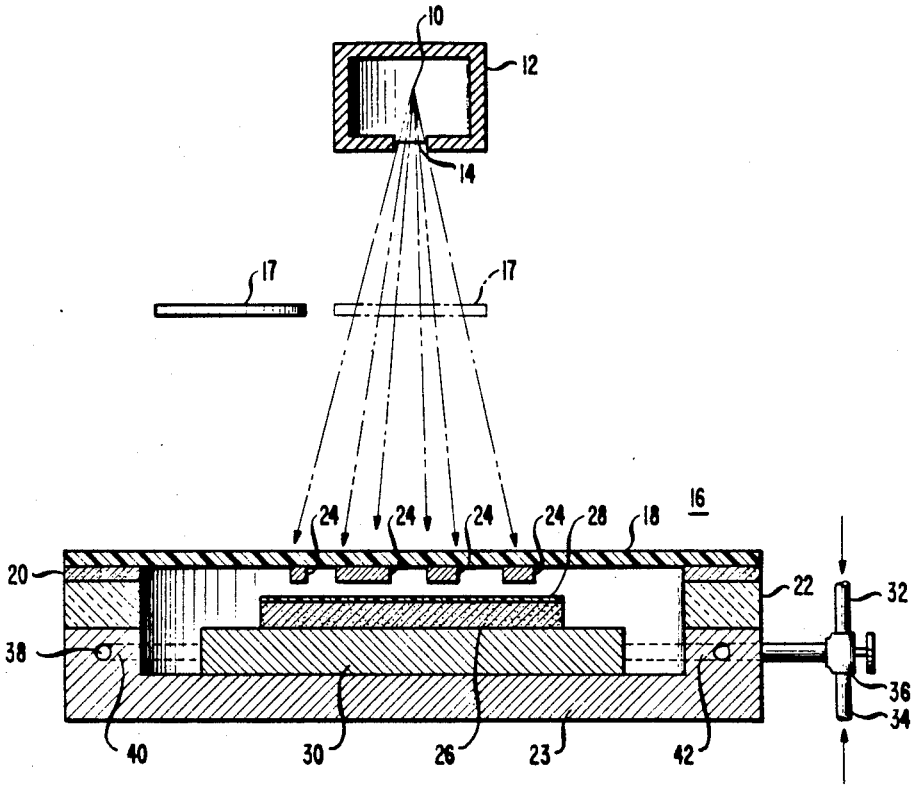
10
12
14
17
17
16
24
24
24
24
28
18
20
22
32
38
36
34
40
30
26
23
42

CONTROLLING RESOLUTION OF EXPOSED RESIST IN DEVICE LITHOGRAPHY

BACKGROUND OF THE INVENTION

This invention relates to microminiature devices and, more particularly, to the fabrication of fine-line integrated-circuit devices utilizing high-resolution resists.

One technology being actively explored as a promising approach for achieving fine-line patterning of devices is X-ray lithography. An illustrative X-ray lithographic system utilized to make structures such as very-large-scale-integrated (VLSI) semiconductor devices is described in an article by M. P. Lepselter entitled "Scaling the Micron Barrier with X-Rays," *Technical Digest* 1980 *IEDM*, page 42.

Sensitive resists suitable for high resolution in X-ray lithography are known. By way of example, these include negative resists such as DCOPA (dichloro propyl acrylate and glycidyl methacrylate-co-ethyl acrylate) which is described in U.S. Pat. No. 4,225,664 and by G. N. Taylor, G. A. Coquin and S. Somekh in "Sensitive Chlorine-Containing Resists for X-Ray Lithography," *Polymer Engineering and Science*, Vol. 17, No. 6, pp. 420–429, 1977, and plasma-developed resists such as those described in U.S. Pat. Nos. 4,232,110 and 4,396,704 and by G. N. Taylor, T. M. Wolf and J. M. Moran in "Organosilicon Monomers for Plasma-Developed X-Ray Resists," *Journal Vacuum Science Technology*, Vol. 19, No. 4, pp. 872–880, November/-December 1981. (Herein, a plasma-developed resist of the aforementioned type will be generically referred to as PDXR.) In pricipal, these resists (DCOPA, PDXR et al) are capable of defining micron and submicron features in VLSI devices.

In practice, however, it has been observed that the widths of irradiated features defined in the aforementioned negative X-ray resists often deviate from the widths specified by a designer and actually exposed by X-rays. In a full-field X-ray system, all the defined features on a wafer sometimes exhibit a constant deviation (enlargement) from the specified widths. In a step-and-repeat X-ray system, feature widths consistently vary over the face of the wafer, with features that were first exposed being enlarged most relative to the prescribed widths.

The aforespecified phenomena threatened to limit the use of certain high-resolution negative resists for VLSI fabrication. Accordingly, efforts have been directed by workers in the art aimed at trying to understand the phenomena and to devise a production-worthy solution to the problems caused thereby. It was recognized that such a solution, if achieved, would be an important contribution to the field of making high-quality fine-line integrated-circuit devices.

SUMMARY OF THE INVENTION

Hence, an object of the present invention is to improve device lithography by better controlling the resolution of exposed resist. More specifically, an object of this invention is to better control the resolution of exposed negative resists in X-ray lithography.

Briefly, these and other objects of the present invention are realized in a specific illustrative device fabrication sequence in which a negative resist such as DCOPA or PDXR is lithographically patterned in a precisely controlled manner in an X-ray exposure system. In accordance with the invention, irradiated portions of the resist are systematically exposed to oxygen or air immediately after the resist portions are selectively exposed to X-rays. Applicants have determined that oxygen is effective to terminate a cross-linking reaction initiated in the resist by X-ray exposure. Unless systematically terminated, the cross-linking reaction continues and in effect enlarges defined features even after the exposing X-rays no longer impinge upon the resist.

In a full-field X-ray exposure system, an entire resist-coated wafer is patterned in a single X-ray exposure. In accordance with the present invention, the wafer is exposed to oxygen or air immediately after the full-field X-ray exposure is terminated. In that way, the cross-linking reaction in the exposed resist is prevented from continuing to propagate after the exposing radiation is removed. Close conformity between specified feature widths and actual cross-linked portions of the resist is thereby insured.

In a step-and-repeat X-ray exposure system, successive portions of a resist-coated wafer are patterned in sequence by a respective series of X-ray exposures. In accordance with this invention, the wafer is exposed to oxygen or air immediately after the X-ray exposure of each portion is terminated. The cross-linking reaction in each exposed portion is thereby effectively stopped after the exposing radiation is removed.

BRIEF DESCRIPTION OF THE DRAWING

A complete understanding of the present invention and of the above and other features thereof may be gained from a consideration of the following detailed description presented hereinbelow in connection with the accompanying single-FIGURE drawing, not drawn to scale, which is a simplified schematic showing of a portion of a specific illustrative lithographic system.

DETAILED DESCRIPTION

For illustrative purposes, emphasis herein will be directed to applying the principles of the present invention to X-ray lithography. But it is to be understood that these principles are also applicable to other technologies in which a propagating reaction in an exposed resist is to be effectively quenched immediately after removal of the exposing radiation.

By way of example, a particular illustrative X-ray lithographic system will be specified herein. The specific system described below and represented in the drawing of this application is of the type disclosed by M. P. Lepselter et al in "A Systems Approach to 1-$\mu$m NMOS," *Proceedings IEEE*, Vol. 71, No. 5, May 1983, page 640 (see, in particular, pages 648–649 and FIG. 18 of the cited article).

As indicated in the drawing in this application, an X-ray source 10 is contained in a vacuum chamber 12. The source 10 comprises a stationary water-cooled palladium anode that is bombarded by electrons. X-rays emitted by the source 10 at the 4.36-Å palladium line are transmitted through a beryllium window 14 and directed at a mask 16. The space between the window 14 and the mask 16 is filled with helium slightly above room pressure to prevent air from getting into this space.

Illustratively, the system shown in the drawing includes a mechanical shutter 17, made, for example, of brass. When the shutter is in its depicted open position, X-rays can propagate toward the mask 16 and the resist layer 28. On the other hand, when the shutter is moved to the right, to the closed position indicated by dot-dash lines, X-rays are blocked from reaching the mask and resist layer.

The mask 16 includes, for example, a membrane 18 that comprises a 4-μm-thick layer of boron, nitrogen and hydrogen overcoated with a polyimide layer 2 μm thick. The membrane 18 is supported by an annular ring 20 of silicon. In turn, the silicon ring 20 is bonded to a rigid annular ring 22 made of glass. The ring 22 is shown mounted on the top surface of a base member 23 of the system.

An X-ray-absorptive layer (300 Å of tantalum) overcoated with 6000 Å of gold and 800 Å of tantalum) is deposited on the membrane 18 of the mask 16 and patterned using an electron-beam exposure system. Several elements 24 of that pattern are shown in the drawing.

A wafer 26 coated with a layer 28 of resist rests on a support member 30 mounted in a recessed portion of the base member 23. The mask-to-wafer spacing is approximately 40 μm.

The space between the mask 18 and the resist-coated wafer 26 is advantageously filled with a mixture of nitrogen and about 0.05 percent oxygen during X-ray exposure of the resist layer 28, as described in U.S. Pat. No. 4,185,202 and in "Improved Resolution for DCOPA Negative X-ray Resist by Exposure Under a Controlled Atmosphere of Nitrogen and Oxygen," *Journal Vacuum Science Technology*, Vol., 16(6), pp. 2020–2024, November/December 1979. This mixture improves the resolution of the X-ray resist.

To provide the indicated mixture in the mask-to-wafer space, nitrogen and oxygen are respectively supplied via pipes 32 and 34 to a mixing valve 36. The mixture is then applied to a circular tube 38 in the base member 23. From the tube 38, the mixture is distributed through a number of radially extending passageways (e.g., 40, 42) into the depicted mask-to-wafer space. (Leakage from this space occurs, for example, at the interfaces between the base member 23 and the annular ring 22 of the mask.) In practice, nitrogen and about 0.01-to-0.5 volume percent oxygen are flowed into the indicated space prior to and during the interval in which X-rays are directed at the mask 18 and resist layer 28. Higher oxygen concentrations are purposely avoided because such higher concentrations would result in excessively long exposure times.

In a full-field X-ray system, the entire wafer-size extent of the resist layer 28 is selectively exposed during a single irradiation interval. For a typical sensitive resist (such as DCOPA) employed in prototype bright-source systems of the type shown in the drawing and described in the aforecited references, this exposure interval typically approximates 0.5-to-4 minutes. Exposure is typically initiated and terminated by movement of the shutter 17.

Irradiation of a negative X-ray-sensitive polymeric resist such as DCOPA causes free radicals to be generated in the exposed portions of the polymer. In turn, these free radicals migrate or propagate in the negative resist material and cause cross-linking of polymer molecules, as is well known. The cross-linked portions of the resist are designed to remain in place on the wafer after development. Ideally, these cross-linked portions should therefore correspond exactly with features of the pattern defined on the mask.

In practice, however, applicants have observed that the cross-linking reaction in exposed negative resist typically continues, even after the exposing radiation is terminated, if the resist-coated wafer remains in the aforespecified exposure ambient in the mask-to-wafer space. Such continuation can cause additional cross-linking to proceed for an extended period of time (for example, up to about 30 minutes, with approximately one-half the additional cross-linking occurring in the first 4 minutes after X-ray exposure ceases). The additional cross-linking that propagates laterally in the resist is, unfortunately, effective to enlarge mask-defined features in the resist. Especially for micron and submicron features, such enlargement may not be tolerable.

In one particular case observed by applicants, 0.75-μm-size features were initially defined by X-rays in DCOPA resist. These features (that is, the cross-linked portions of the selectively irradiated resist) became enlarged to more than 1.0 μm after remaining in the nitrogen/oxygen exposure ambient for 4 minutes after the X-rays were terminated (shuttered off). Such loss of resolution is of course highly undesirable.

In accordance with the principles of the present invention, pure oxygen or air or a gas mixture including at least approximately 10 volume percent oxygen is introduced into the mask-to-wafer space immediately after a desired X-ray exposure has been achieved. Significantly, the introduction of oxygen into this space is effective to rapidly quench cross-linking in the resist. As a result, the only portions of the resist that end up being cross-linked are the directly exposed portions corresponding to mask-defined features. Loss of resolution due to additional cross-linking after the termination of X-ray exposure is thereby substantially eliminated.

Introduction of a quenching amount of oxygen into the mask-to-wafer space is advantageously carried out by means of the gas distribution arrangement represented in the drawing. In practice, the propagating cross-linking reaction in the resist is thereby completely stopped within typically about several seconds of the initial introduction of a quenching amount of oxygen into the indicated space. In one illustrative procedure, oxygen at about atmospheric pressure was continuously injected into the space for approximately 5-to-10 seconds.

In the presence of a quenching amount of oxygen, no cross-linking in the resist can occur. Accordingly, even if the shutter 17 is not closed at the time quenching oxygen is introduced into the mask-to-wafer space, cross-linking of the resist is effectively stopped within about several seconds. Thus, if desired, the shutter 17 can be closed at some convenient later time after the initial injection of oxygen. In that case, the injected oxygen acts in effect as a relatively fast chemical shutter.

After the aforespecified quenching step, the mask-to-wafer space can be returned to its ready-to-expose condition by flushing the quenching oxygen from the space. This is done, for example, by interrupting the flow of quenching oxygen into the space and re-establishing therein the aforementioned nitrogen/oxygen mixture utilized during exposure. About five seconds after this re-establishment, the space is typically sufficiently free of quenching oxygen to resume X-ray exposure.

The principles of the present invention are also applicable and indeed may be especially crucial to step-and-repeat X-ray lithography. In a step-and-repeat system, the mask 18 shown in the drawing is generally referred to as a reticle and includes, for example, a pattern that is to be repeatedly transferred to successive respective portions of the resist layer 28. After each such exposure, the resist-coated wafer is stepped to a new location in the exposure space to position another resist portion in registry with the reticle. Another exposure is then repeated.

Thus, in a step-and-repeat system, resist portions are sequentially exposed. And, since the reticle-to-wafer space of such a system also advantageously includes during exposure a nitrogen/oxygen mixture of the type specified above, the features in first exposed negative resist portions will be typically enlarged relative to later-exposed portions. As before, this is attributed to a propagating cross-linking reaction that persists for an extended period even after exposing radiation is removed from a particular portion of the resist.

As a result, the resolution specified for the successive patterns exposed in a step-and-repeat system is lost most in the first-exposed resist portion. Moreover, the actual achieved feature size from pattern to pattern over the full face of the wafer will likely be nonuniform.

In accordance with the principles of the present invention, quenching of the propagating cross-linking reaction in a step-and-repeat system is effectively accomplished by subjecting each portion of the resist layer to a quenching atmosphere immediately after X-ray exposure thereof. As before, such an atmosphere comprises pure oxygen or air or a gas mixture including at least approximately 10 volume percent oxygen.

The aforementioned quenching action may be achieved in a step-and-repeat system by introducing one of the specified gases into the reticle-to-wafer space of the system. But since this space is typically voluminous (relative to the mask-to-wafer space in a full-field exposure system) a longer-than-desired time may, in practice, be required to replace the exposing ambient with the quenching one. In such cases, it is preferable and effective simply to physically remove the resist-coated wafer from the controlled exposure space immediately after exposure of each resist portion. Exposure to room air, for example, will suffice to quickly quench the propagating cross-linking reaction in each just-exposed portion.

Finally, it is to be understood that the above-described techniques are only illustrative of the principles of the present invention. In accordance with these principles, numerous modifications and alternatives may be devised by those skilled in the art without departing from the spirit and scope of the invention. For example, although primary emphasis herein has been directed to utilizing oxygen as a quenching agent for particular negative resist materials, it is to be understood that other quenching techniques may be effective for terminating radiation-initiated propagating reactions in other materials.

What is claimed is:

1. A method of making microminiature devices comprising the steps of selectively irradiating a negative X-ray-sensitive-resist-coated workpiece with X-rays in a controlled atmosphere in which radiation-initiated laterally propagating cross-linking reactions continue in the resist even after radiation no longer impinges on the resist, and, immediately after irradiation of the resist, quenching said laterally propagating reactions by exposing the just-irradiated resist to an atmosphere that contains at least 10 volume percent oxygen.

2. A method as in claim 1 wherein said workpiece comprises a semiconductor wafer.

3. A method as in claim 2 wherein said devices comprise fine-line integrated-circuit devices.

4. A method as in claim 3 wherein said quenching atmosphere is selected from the group consisting of air, pure oxygen and a mixture including at least 10 volume percent oxygen.

5. A method as in claim 4 wherein said resist is selected from the group consisting of DCOPA and PDXR resists.

6. A method as in claim 5 wherein said wafer is selectively irradiated with X-rays in a full-field exposure mode and said quenching step occurs after said full-field X-ray exposure.

7. A method as in claim 6 wherein said controlled atmosphere comprises nitrogen and about 0.01-to-0.5 volume percent oxygen.

8. A method as in claim 5 wherein regions of said resist-coated wafer are selectively irradiated with X-rays in sequence in a step-and-repeat mode and said quenching step occurs immediately after irradiation of each region.

9. A method as in claim 8 wherein said controlled atmosphere comprises nitrogen and about 0.01-to-0.5 volume percent oxygen.

10. Apparatus for defining fine-line patterns in a resist-coated workpiece by selective irradiation of said workpiece, said apparatus comprising a chamber for holding said resist-coated workpiece to be selectively irradiated, said chamber being adapted to contain a controlled atmosphere of the type in which radiation-initiated propagation reactions continue in the resist even after radiation no longer impinges on the resist, and means for quenching said propagating reactions immediately after irradiation of the resist by exposing the just-irradiated resist to an atmosphere that contains at least 10 volume percent oxygen.

11. Apparatus as in claim 10 further including means for directing X-rays at the surface of said resist-coated workpiece via a mask member to selectively irradiate the resist-coated workpiece in a full-field mode.

12. Apparatus as in claim 11 wherein said quenching means comprises means for establishing in said chamber, immediately after irradition of the resist-coated workpiece, an atmosphere that contains at least 10 volume percent oxygen.

13. Apparatus as in claim 10 further including means for directing X-rays at successive specified regions of the surface of said resist-coated workpiece via a reticle member to selectively irradiate the specified regions in sequence in a step-and-repeat mode.

14. Apparatus as in claim 13 wherein said quenching means comprises means for subjecting each region, immediately after irradiation thereof, to an atmosphere that contains at least 10 volume percent oxygen.

15. A method of making microminiature devices comprising the steps of selectively irradiating a negative X-ray-sensitive-resist-coated workpiece with X-rays in a controlled atmosphere in which radiation-initiated laterally propagating cross-linking reactions continue in the resist even after radiation no longer impinges on the resist, and, immediately after irradiation of the resist, quenching said laterally propagating reactions.

16. A method as in claim 15 wherein regions of said resist-coated wafer are selectively irradiated in sequence in a step-and-repeat mode and said quenching step occurs periodically after irradiation.

17. A method as in claim 16 wherein said quenching step occurs immediately after irradiation of each region.

* * * * *